(12) United States Patent
Kurabayashi et al.

(10) Patent No.: US 6,977,406 B2
(45) Date of Patent: Dec. 20, 2005

(54) SHORT CHANNEL INSULATED-GATE STATIC INDUCTION TRANSISTOR AND METHOD OF MANUFACTURING THE SAME

(75) Inventors: Toru Kurabayashi, Tokyo (JP); Toru Oizumi, Tokyo (JP); Kyouzou Kanamoto, Tokyo (JP); Jun-ichi Nishizawa, Tokyo (JP)

(73) Assignees: National Institute of Information and Communications Technology, Incorporated Administrative Agency, Tokyo (JP); Zaidan Hojin Handotai Kenkyu Shinkokai, Miyagi (JP)

( * ) Notice: Subject to any disclaimer, the term of this patent is extended or adjusted under 35 U.S.C. 154(b) by 87 days.

(21) Appl. No.: 10/475,693

(22) PCT Filed: Apr. 26, 2002

(86) PCT No.: PCT/JP02/04266

§ 371 (c)(1),
(2), (4) Date: Oct. 24, 2003

(65) Prior Publication Data

US 2004/0178442 A1   Sep. 16, 2004

(30) Foreign Application Priority Data

Apr. 27, 2001  (JP) ............................. 2001-133136
Apr. 27, 2001  (JP) ............................. 2001-133137

(51) Int. Cl.$^7$ ............................................. H01L 29/76

(52) U.S. Cl. ................... 257/302; 257/327; 257/328; 257/329; 257/E29.262; 257/E29.274

(58) Field of Search ................... 257/302, 327–329, 257/E29.262, E29.274

(56) References Cited

U.S. PATENT DOCUMENTS

| | | | |
|---|---|---|---|
| 4,636,823 A | * | 1/1987 | Margalit et al. ............ 257/192 |
| 5,060,029 A | | 10/1991 | Nishizawa et al. |
| 5,160,491 A | * | 11/1992 | Mori .......................... 438/270 |
| 6,180,958 B1 | * | 1/2001 | Cooper, Jr. ................... 257/77 |

FOREIGN PATENT DOCUMENTS

| | | |
|---|---|---|
| EP | 0 268 472 | 5/1988 |
| JP | 54-125986 | 9/1979 |
| JP | 4-82275 | 3/1992 |
| JP | 10-93110 | 4/1998 |

OTHER PUBLICATIONS

Jun-ichi Nishizawa et al.; Semiconductor Research Institute, 11$^{th}$ SI Device Symposium Koen Ronbunshu, Feb. 5, 1998, pp. 57-64. See PCT search report.
J. Nishizawa et al.; IEE Proceedings-Circuits, Devices and Systems, pp. 27-30, 1999. See PCT search report.

* cited by examiner

Primary Examiner—George Fourson
Assistant Examiner—Thanh V. Pham
(74) Attorney, Agent, or Firm—Westerman, Hattori, Daniels & Adrian, LLP

(57) ABSTRACT

The ultra high-speed vertical short channel insulated-gate static induction transistor with uniform operating characteristic which has the drain layer 3 consisting of an epitaxial single crystal layer on the main surface 2 of substrate 1, the channel layer 4 with thickness 1000 Å or less on the drain layer, the source layer 5 consisting of an epitaxial single crystal layer on the channel layer 4, and the insulated-gates 6 and 7 on the sidewalls of the drain, the channel, and the source layers. Since the thickness of 1000 Å or less is accurately controlled using the molecular layer epitaxial method and the channel layer 4 is grown up, the X-ray photolithography is not needed. Since the gate oxide film is formed by low temperature CVD using active oxygen, impurity re-distribution does not occur.

3 Claims, 8 Drawing Sheets

F I G. 1
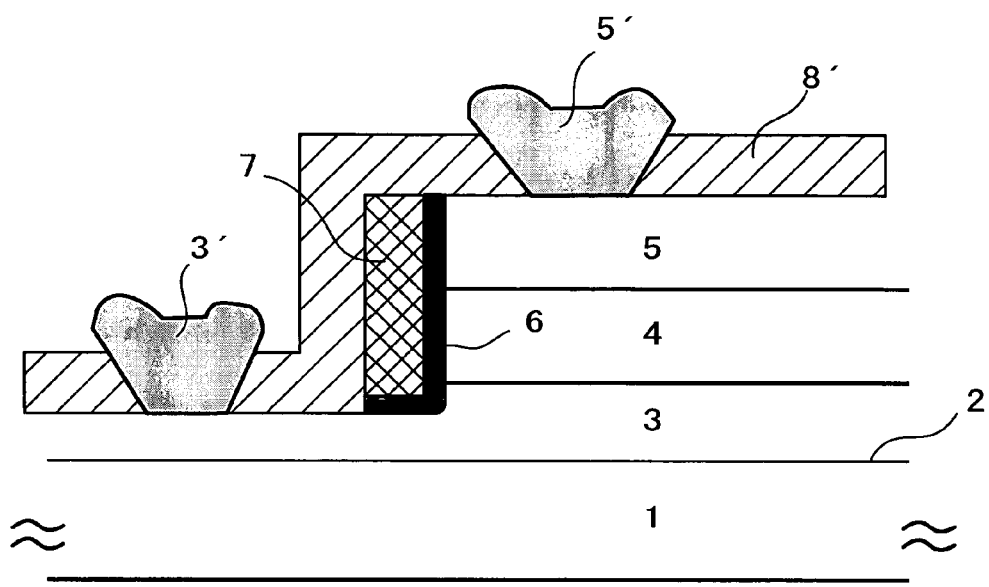

F I G. 4
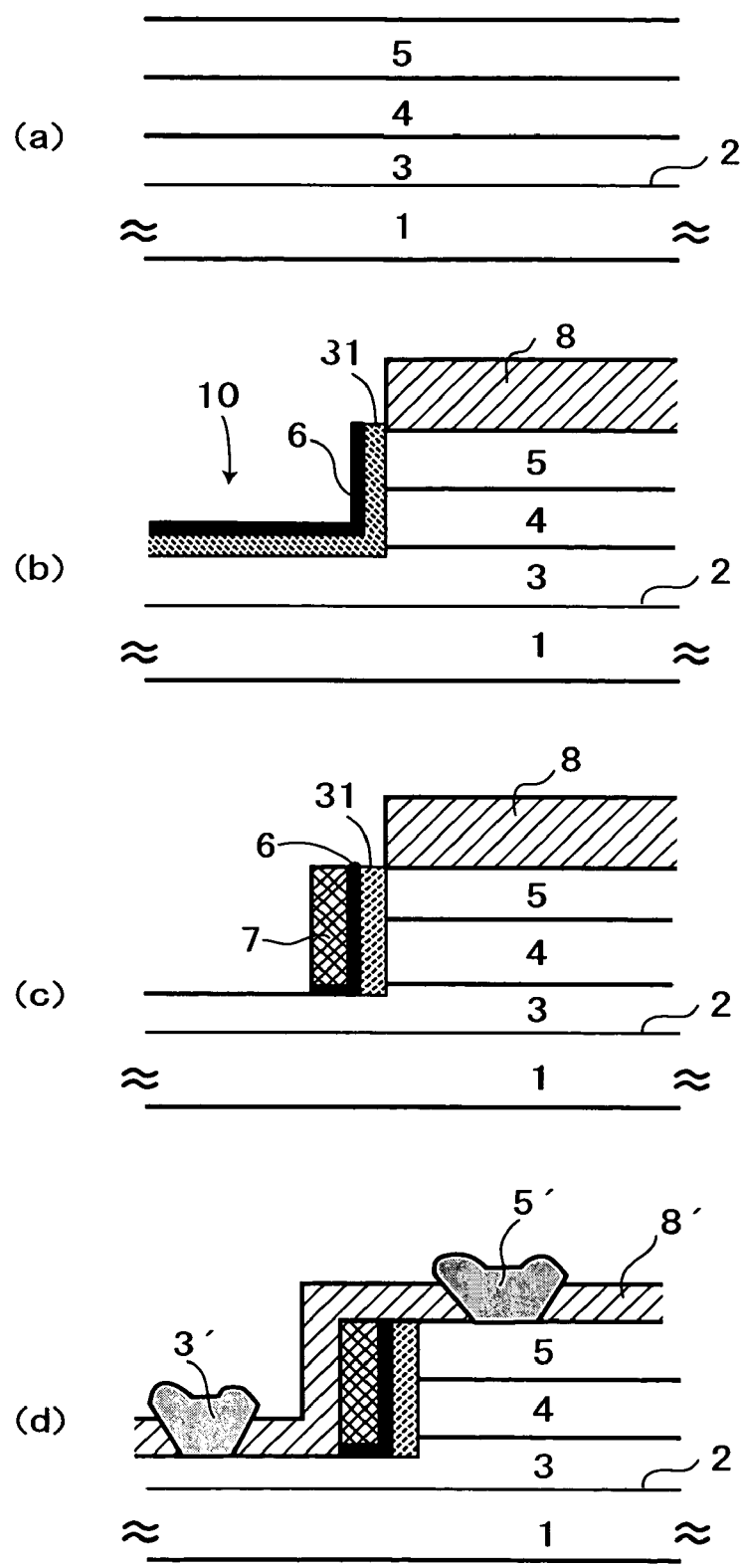

(a)

(d)

(b)

(e)

(c)

SHORT CHANNEL INSULATED-GATE STATIC INDUCTION TRANSISTOR AND METHOD OF MANUFACTURING THE SAME

TECHNICAL FIELD

The present invention relates to a short channel insulated-gate static induction transistor having a high operation speed, especially, a vertical and a planar type short channel insulated-gate static induction transistor, and a method of manufacturing the same.

BACKGROUND ART

The insulated-gate static induction transistor has been used for high frequency amplifiers and integrated circuits which has the required high driving capability and the high operation speed. The insulated-gate static induction transistor was proposed by Jun-ichi Nishizawa who is one of the inventors of the present invention, and was published, for example, in JP,58-56270B, and JP,H3-00792B, etc. The insulated-gate static induction transistor and the insulated-gate transistor (MOS transistor, for example) are equivalent in that these have a source, a channel, and a drain, and currents flowing in them are controlled by a gate voltage, however their operation principles are different. That is, a potential barrier in the insulated-gate static induction transistor is formed by the gate voltage and the number of carriers traveling from the source to the drain are controlled by this potential barrier, on the contrary, in the insulated-gate transistor a semiconductor surface carrier density of an interface between a semiconductor surface and a gate insulator layer is changed by the gate voltage, and then the number of carriers traveling from the source to the drain is controlled by the gate voltage.

The insulated-gate static induction transistor is so designed that the effect of the drain electric field can have an influence on the source, and the current can be flown not only in the semiconductor-insulator interface but also inside of the substrate, so that it has such outstanding properties as an unsaturated current voltage characteristics, a high current driving capability, and a high speed performance etc.

However, the demand for an improvement of a data processing speed is more and more unlimited, and a further improvement in speed will be required for also in the insulated-gate static induction transistor. In order to increase the speed of the insulated-gate static induction transistor and the insulated-gate transistor, it is effective to shorten a channel length, the development of the insulated-gate transistor which has the cannel length of 1000 Å or less is progressing for a mass production, and also the channel length below the level of several 100 Å are being developed.

However, the depletion layer of the source and that of the drain approach or connect each other when a channel becomes shorter and shorter, it has such an intrinsic restriction in operation that currents in a short channel insulated-gate transistor become uncontrollable by the gate voltage. In the manufacturing method of an insulated-gate transistor using photolithography to form a short channel, a channel length of the insulated-gate transistor is determined by a light wavelength of photolithography, and then the shorter wavelength of the light source, i.e. an X-ray, is required to realize a channel length of 1000 Å or less. It is difficult to focus or bend an optical path of an X-ray, therefore an X-ray lithography apparatus is large and its cost is expensive, and also safety precautions to workers' to prevent an X-ray radiation exposure are indispensable.

As just described, a short channellization of an insulated-gate transistor is not making advances. Although an electron device based on an entirely new principle of an operation, for example, the device called a single electron transistor has been proposed, it does not go beyond the research. As will be understood from the foregoing description, a potential barrier is formed by the gate voltage and the number of carriers traveling from the source to the drain is controlled by it as the principle of operation in the insulated-gate static induction transistor, such a phenomenon does not occur that the depletion layer of the source and that of the drain connect each other, and hence the current becomes uncontrollable, and so it does not produce any restriction at all in the short channel insulated-gate static induction transistor.

And, when the molecular layer epitaxy method (see, for example, U.S. Pat. No. 5,294,286), which was invented by Dr. Jun-ichi Nishizawa et. al who is one of the inventors of the present invention, is used, a short channel can be grown with precision as accurate as single molecular layer without using the X-ray lithography apparatus.

Thus, the insulated-gate static induction transistor is highlighted as a next-generation ultra high-speed electron device.

Next, a prior art insulated-gate static induction transistor will be explained. FIG. 8 illustrates the manufacturing method and the structure of the prior art insulated-gate static induction transistor, and its manufacturing process is as follows. First, as shown in FIG. 8(a), an epitaxial layer 52 is grown as a channel on a semiconductor substrate 51, and then a projection portion 52 is formed by using anisotropic etching. As shown in FIG. 8(b), the masking is carried out using a field oxide film 53, and a gate oxide film 54 is formed in the portion of a device fabrication region.

Next as is shown in FIG. 8(c), the polycrystalline semiconductor as for a gate electrode 55 is deposited and etched to form a gate electrode on a sidewall of the projection region 52 by the anisotropic etching, and a drain 56 and a source 57 are formed by the ion implantation using a gate electrode 55 as a mask.

And as shown in FIG. 8(d), a passivation film 58 is deposited, holes are opened onto the passivation film 58 for electrodes, a drain electrode 56' and a source electrode 57' are formed, and finally an annealing process for impurity activation is carried out.

In the structure of the insulated-gate static induction transistor mentioned above, the high temperature processes for the activation of the ion implanted impurities and for the gate oxide layer formation are indispensable, then impurities are distributed during these high temperature processes, and especially the impurities of the drain 56 were diffused into the channel 52 to shorten the channel length. When a channel length of the device becomes as same as the diffusion length of impurities, it is varied by every impurity diffusion process, a problem has been associated as a consequence that an operation characteristics is changed for each transistor.

Although the height of the projection part 52 may be influenced to the length of a channel, the accuracy of the anisotropic etching can not correspond to the channel length of 1000 Å or less, and, for this reason, a problem has been encountered that the insulated-gate static induction transistor of a certain channel length cannot be manufactured with a sufficient accuracy and with a good reproducibility.

At the same time, in this structure of the insulated-gate static induction transistor as shown in FIG. 8(d), the gate electrode 55 and the gate oxide film 54 are contacted with not only the channel 52 but also the drain 56 and the source 57. For this reason, parasitic capacitances are generated among the gate electrode 55, the drain 56 and the source 57, so the problem has been encountered that an operation speed of the device is limited by these parasitic capacitances especially when a short channel is formed.

Considering the above described problems, the primary object of the present invention is to provide an ultra high-speed vertical type short channel insulated-gate static induction transistor with a uniform operating characteristics which has a short channel length of 1000 Å to 100 Å.

Furthermore, the second object of the present invention is to provide an ultra high-speed planar type short channel insulated-gate static induction transistor with a channel length from 1000 Å to 100 Å and with the parasitic capacitance as small as to the limit.

And, furthermore, the third object of the present invention is to provide their manufacturing methods of the same.

DISCLOSURE THE INVENTION

In order to achieve the first object mentioned above, there is provided in accordance with the present invention thereof a vertical type short channel insulated-gate static induction transistor comprising a drain layer consisting of an epitaxial single crystal layer on a main surface of a substrate, a channel layer consisting of an epitaxial single crystal layer of thickness 1000 Å or less on said drain layer, and a source layer consisting of an epitaxial single crystal layer on said channel layer, and an insulated-gate being formed on the sidewall of said drain layer, said channel layer, and said source layer.

According to the structure mentioned above, since the channel layer consists of the epitaxial single crystal layer with thickness of high-accuracy, the accuracy of channel length is high, and therefore the operating characteristics becomes uniform with no variance among transistors. Since the thickness of the channel layer is 1000 Å or less and the transit time of carriers between the source and the drain is short, therefore an ultra high operation speed can be obtained.

In the structure mentioned above, preferably, said substrate is a Si single crystal, said main surface is a (100) or its equivalent plane, said channel layer is a p type Si epitaxial single crystal layer, said source layer and said drain layer are n type Si epitaxial single crystal layers, and said insulated-gate consists of the $SiO_2$ and the polysilicon.

And, in the structure mentioned above, preferably, said substrate is Si single crystal, said main surface is a (100) or its equivalent plane, said channel layer is n type Si epitaxial single crystal layer, said source layer and said drain layer are p type Si epitaxial single crystal layers, and said insulated-gate consists of the $SiO_2$ and the polysilicon.

According to these structures, the vertical type short channel insulated-gate static induction transistor can be manufactured by the Si semiconductor technology which is the most widely used.

In order to achieve the second object mentioned above, there is provided in accordance with the present invention thereof a planar type short channel insulated-gate static induction transistor comprising: a channel layer of channel length 1000 Å or less, a source layer, a drain layer being arranged in parallel with a main surface of a substrate, characterized in that an insulated-gate in which width is as nearly same as that of channel length is provided right on a channel layer.

According to this structure, the transit time of carriers between the source and the drain is short because the channel length is short, and there arises no parasitic capacitance since the insulated-gate has a width as same as that of the channel length, and therefore, the ultra high operation speed can be attained.

In the structure mentioned above, preferably, said substrate is a Si single crystal, said main surface is a (100) or its equivalent plane, said channel layer is a p type Si single crystal layer, said source layer and said drain layer are n type Si single crystal layers, and said insulated-gate consists of the $SiO_2$ and the polysilicon.

And, in the structure mentioned above, preferably, said substrate is Si single crystal, said main surface is a (100) or its equivalent plane, said channel layer is a n type Si single crystal layer, said source layer and said drain layer are p type Si single crystal layers, and said insulated-gate consists of the $SiO_2$ and the polysilicon.

According to these structures, the planar type short channel insulation gate static induction transistors can be manufactured by the Si semiconductor technology which is the most widely used.

In order to achieve the third object mentioned above, there is provided in accordance with the present invention thereof a method of manufacturing a vertical type short channel insulated-gate static induction transistor comprising the steps of: growing a drain layer epitaxially on a main surface of a semiconductor substrate with a specific plane direction; growing a channel layer by controlling epitaxial growth of every mono molecular layer consisting of the channel on said drain layer; depositing a passivation film on said source layer; opening holes in said passivation film and forming a U-shaped groove perpendicular to said main surface to the depth to said semiconductor substrate; depositing a gate oxide film on said U-shaped groove; depositing a gate electrode layer on said gate oxide film, and an insulated-gate consisting of said gate oxide film and said gate electrode being formed by leaving said gate oxide film layer and said gate electrode layer on a sidewall of said U-shaped groove.

According to the method of the manufacturing mentioned above, it is made possible to fabricate the vertical type insulated-gate static induction transistor with the gate length of 1000 Å or less with a high accuracy without using the X-ray photolithography.

In the method of the manufacturing mentioned above, said process to grow a channel layer by controlling epitaxial growth of every mono molecular layer are comprising the steps of: exposing said semiconductor substrate surface set in a vacuum vessel to a compound gas of a semiconductor element and evacuating a certain time, and after this exposing and evacuating, exposing said surface to a compound gas of a dopant element for a certain time and evacuating a certain time, and repeating these two steps alternately.

According to the method of the manufacturing mentioned above, it is made possible to form the channel length from 1000 Å to 100 Å with ease and a high accuracy, because it is possible to form the channel layer by mono molecular layer accuracy by controlling the number of cycles comprising said two steps. Also, since a single crystal film is epitaxially grown by said cycles, such a high temperature thermal treatment for an impurity activation etc. is not necessary.

In the method of the manufacturing mentioned above, said process to form said U-shaped groove is an anisotropic plasma etching with a high etching speed in the direction perpendicular to said main surface.

According to the method of the manufacturing mentioned above, the U-shaped groove having vertical sidewall perpendicular to said main surface can be formed, and consequently it enables to form said insulated-gate perpendicular to said channel layer.

In the method of the manufacturing mentioned above, said process to deposit said gate oxide film is a low temperature CVD in which a compound gas of a semiconductor element and all active oxygen gas react on a surface of said semiconductor substrate.

According to the method of the manufacturing mentioned above, the length of the channel can be controlled to the designed specification, since the impurities of the channel layer, the source layer, and the drain layer are not redistributed.

In the method of the manufacturing mentioned above, said process to deposit said gate electrode layer is a low temperature CVD to deposit polycrystalline semiconductor by decomposing the compound gas of a semiconductor element on a surface of said semiconductor substrate.

According to the method of the manufacturing mentioned above, a sufficient thickness of the gate electrode layer can also be deposited on the sidewall of the U-shaped groove.

In the method of the manufacturing mentioned above, said process to leave said gate oxide film layer and gate electrode layer on the sidewall of U-shaped groove is an anisotropic plasma etching with a high etching speed in the direction perpendicular to said main surface, and said gate oxide film layer and gate electrode layer is left on the sidewall of U-shaped groove by an etching of using of thickness difference between the thickness in the direction perpendicular to said main surface and the film thickness.

According to the method of the manufacturing mentioned above, it is made possible to leave the gate electrode and the gate oxide film only on the sidewall by controlling the etching time, since the gate electrode deposited on the sidewall of U-shaped groove is thick in the direction perpendicular to the main surface.

In the method of the manufacturing mentioned above, said compound gas of a semiconductor element is $Si_2H_6$ (disilane). And said compound gas of a dopant element is preferably $PH_3$ (phosphine) in case of an n type dopant, and $B_2H_6$ (diborane) in case of a p type dopant.

According to the method of the manufacturing mentioned above, a p type, a n type, and an i type channel can be formed.

In order to achieve the third object mentioned above, there is also provided in accordance with the present invention thereof a method of manufacturing a planar type short channel insulated-gate static induction transistor comprising the steps of: growing a drain layer epitaxially on a main surface of a semiconductor substrate with a specific plane direction; depositing a passivation film on said drain layer; making openings of said passivation film and forming a U-shaped groove in the direction perpendicular to said main surface to the depth to said semiconductor substrate; growing a channel layer and a source layer by controlling epitaxial growth of every mono molecular layer onto said U-shaped groove; depositing a gate oxide film on said channel layer and said source layer grown on said main surface, depositing a gate electrode layer on said gate oxide film, and an insulated-gate consisting of said gate oxide film and said gate electrode being formed by leaving said gate oxide film layer and said gate electrode layer on said sidewall of said U-shaped groove.

According to the method of the manufacturing mentioned above, it is made possible to manufacture the planar type short channel insulated-gate static induction transistor having a gate length of 1000 Å or less with a high accuracy without using the X-ray photolithography.

In the method of the manufacturing mentioned above, said process to form said U-shaped groove is an anisotropic plasma etching with a high etching speed in the direction perpendicular to said main surface.

According to the method of the manufacturing mentioned above, said U-shaped groove having a sidewall perpendicular to said main surface can be made, and consequently, a source layer, a channel layer, and a drain layer can be arranged in parallel with said main surface of said semiconductor substrate.

In the method of the manufacturing mentioned above, said process to grow said channel layer and said source layer by controlling epitaxial growth of every mono molecular layer onto said U-shaped groove comprises from the steps of exposing said semiconductor surface set in a vacuum vessel to a compound gas of a semiconductor element and evacuating a certain time, and after this step, exposing said semiconductor surface to a compound gas of a dopant element and evacuating a certain time, and repeating these two steps alternately.

According to the method of the manufacturing mentioned above, it is made possible to form the channel of the length from 1000 Å to 100 Å with ease and a high accuracy, and also it is made possible to grow only on the sidewall and on the bottom of said U-shaped groove because of the low process temperature. Also, since a single crystal film is grown in said cycles, such a high temperature thermal treatment for an impurity activation etc. is not necessary.

In the method of the manufacturing mentioned above, said process to deposit said gate oxide film is a low temperature CVD in which a compound gas of a semiconductor element and an active oxygen gas react on a surface of said semiconductor substrate so as to grow said gate oxide film.

According to the method of the manufacturing mentioned above, the length of the channel can be controlled to the designed specification, since the impurities of the channel layer, the source layer, and the drain layer are not redistributed, because of said low temperature process.

In the method of the manufacturing mentioned above, said process to deposit said gate electrode layer is a low temperature CVD to deposit polycrystalline semiconductor by decomposing the compound gas of a semiconductor element on a surface of said main surface.

According to the method of the manufacturing mentioned above, a sufficient thickness of the gate electrode layer can be deposited on the sidewall of the U-shaped groove.

In the method of the manufacturing mentioned above, said process to leave said gate oxide film layer and gate electrode layer on the sidewall of U-shaped groove is an anisotropic plasma etching with a high etching speed in the direction perpendicular to said main surface, and said gate oxide film layer and gate electrode layer is left only on the sidewall of U-shaped groove by an etching of using of thickness difference between the thickness in the direction perpendicular to said main surface and the film thickness.

According to the method of the manufacturing mentioned above, it is made possible to leave the gate electrode and the gate oxide film to a width as same as that of channel length and just above on said channel.

In the method of the manufacturing mentioned above, said semiconductor substrate with a specific oriented plane is a Si (100) or its equivalent plane.

According to the method of the manufacturing mentioned above, it is possible to select a (010) or its equivalent plane as the sidewall surface of U-shaped groove, and also it is possible to select a <010> or its equivalent direction as the arrangement direction of the source, the channel, and the drain. By selecting a (010) or its equivalent plane as the sidewall surface of U-shaped groove, it is made possible to grow said channel layer selectively on the sidewall of said U-shaped groove.

In the method of the manufacturing mentioned above, said compound gas of a semiconductor element is $Si_2H_6$ (disilane). And said compound gas of a dopant element is $PH_3$ (phosphine) in case of an n type dopant, and $B_2H_6$ (diborane) in case of a p type dopant.

According to the method of the manufacturing mentioned above, a p type, a n type, and an i type channel can be formed.

BRIEF DESCRIPTION OF THE DRAWINGS

The present invention will better be understood from the following detailed description and the drawings attached hereto showing certain illustrative forms of embodiment of the present invention; in this connection, it should be noted that such forms of embodiment illustrated in the accompanying drawings hereof are intended in no way to limit the present invention but to facilitate an explanation and an understanding thereof, in which drawings:

FIG. 1 shows a structure of a vertical type short channel insulated-gate static induction transistor of the present invention;

FIG. 4 shows a method of manufacturing and a structure of a low power consumption vertical type short channel insulated-gate static induction transistor manufactured by a method of the present invention;

BEST MODES FOR CARRYING OUT THE INVENTION

Figure 2:
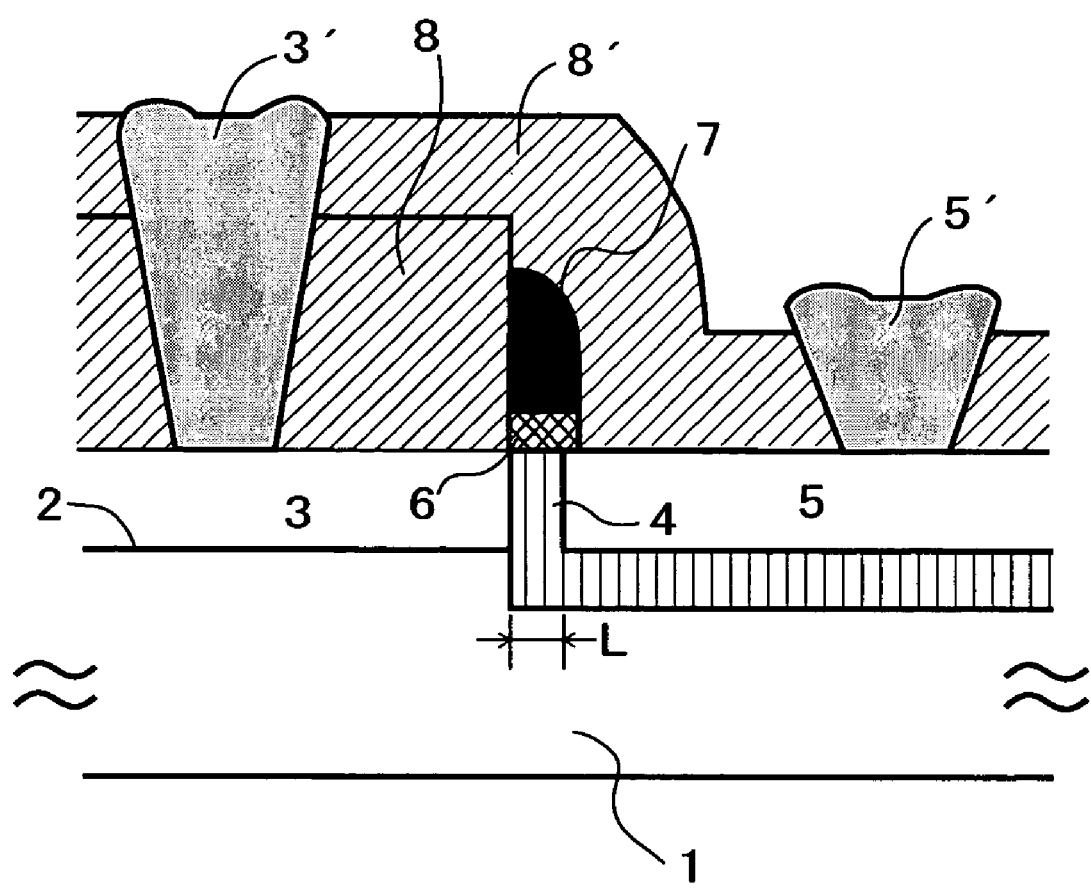
FIG. 2 shows a structure of a planar type short channel insulated-gate static induction transistor of the present invention.

Hereinafter, an explanation is given in respect of a vertical type short channel insulated-gate static induction transistor, a planar type short channel insulated gate static induction transistor, and the methods of manufacturing thereof as suitable forms of embodiment of the present invention, references being made to FIGS. 1 to 7. Here the substantially same parts are given same reference numerals.

A vertical type short channel insulated-gate static induction transistor of this invention is explained first.

FIG. 1 is a diagrammatic sectional view showing a structure of a vertical type short channel insulated-gate static induction transistor of the present invention.

As shown in FIG. 1, a vertical type short channel insulated-gate static induction transistor of the present invention has a semiconductor substrate 1, and a drain layer 3 which is an epitaxial single crystal layer on a main surface 2 of a semiconductor substrate 1, a channel layer 4 which is an epitaxial single crystal layer with specific thickness of 1000 Å or less on the drain layer 3, and a source layer 5 which is an epitaxial single crystal layer on the channel layer 4, and it also has a gate oxide film 6 and a gate electrode 7 on the sidewall of the drain layer 3, the channel layer 4, and the source layer 5, and the drain electrode 3' at the end of the drain layer 3 and the source electrode 5' right above the source layer 5, respectively, and the insulated passivation film 8' to insulate and support these electrodes.

The semiconductor substrate 1, for example, is Si single crystal, the main surface 2 is (100) or its equivalent plane, the channel layer 4 is a p type Si epitaxial single crystal layer, a drain layer 3 and a source layer 5 are an n type Si epitaxial single crystal layers, and the gate oxide film 6 and the gate electrode 7 are the $SiO_2$ and the polysilicon, respectively. The channel layer 4 may be an n type Si epitaxial single crystal layer, and the drain layer 3 and the source layer 5 may be a p type Si epitaxial single crystal layers.

According to the above described structure of the vertical type short channel insulated-gate static induction transistor of the present invention, its carrier transit time between the source and the drain can be made possible to be very short by virtue of its extremely short channel length. And also, the accuracy of channel length is very precise, since the channel layer is determined by the thickness of the epitaxial single crystal layer.

Next, a planar short type channel insulated-gate static induction transistor of the present invention will be explained. FIG. 2 is a diagrammatic sectional view, showing a structure of a planar type short channel insulated-gate static induction transistor of the present invention.

FIG. 2 shows a sectional view perpendicular to a main surface of a substrate in the arrangement direction to a source layer, a channel layer, and a drain layer. In FIG. 2, a planar type short channel insulated-gate static induction transistor of the present invention has a semiconductor substrate 1, a drain layer 3, a channel layer 4 having a channel length less than 1000 Å, and a source layer 5. Said drain layer 3, said channel layer 4, and said source layer 5 are so arranged to contact mutually and in parallel with a main surface 2 of said semiconductor substrate 1, and their heights i.e. thickness in the direction perpendicular to said main surface 2 are the same. It also has a gate oxide film 6 and a gate electrode 7 of the width approximately equal to the channel length L right above the channel layer 4, and the insulated-gate comprises of the gate oxide film 6 and the gate electrode 7. It also has a drain electrode 3' and a source electrode 5' right above the drain layer 3 and the source layer 5, respectively, and has an insulated passivation film 8 and 8' to insulate and support these electrodes.

And, for example, the semiconductor substrate 1 is a Si single crystal, its main surface 2 is a (100) or its equivalent plane, the channel layer 4 is a p type Si single crystal layer, the drain layer 3 and the source layer 5 are an n type Si single crystal layers, and the gate oxide film 6 and the gate electrode 7 are $SiO_2$ and the polysilicon, respectively. The channel layer 4, for example, may be an n type Si single crystal layer, and the drain layer 3 and the source layer 5 may be a p type Si single crystal layer.

According to the above described structure of the planar type short channel insulated-gate static induction transistor of the present invention, its carrier transit time between the source and the drain can be made possible to be very short by virtue of its extremely short channel length.

And the width of the insulated-gate which is consisted by the gate oxide film 6 and the gate electrode 7 is almost equal to the channel length L, there does not arise a capacitance, i.e., parasitic capacitance unnecessary for an device operation, and therefore a very high operation speed can be realized.

The operation speed of the THz band is possible by the planar type short channel insulated-gate static induction transistor of the present invention due to above described effect.

Figure 3:
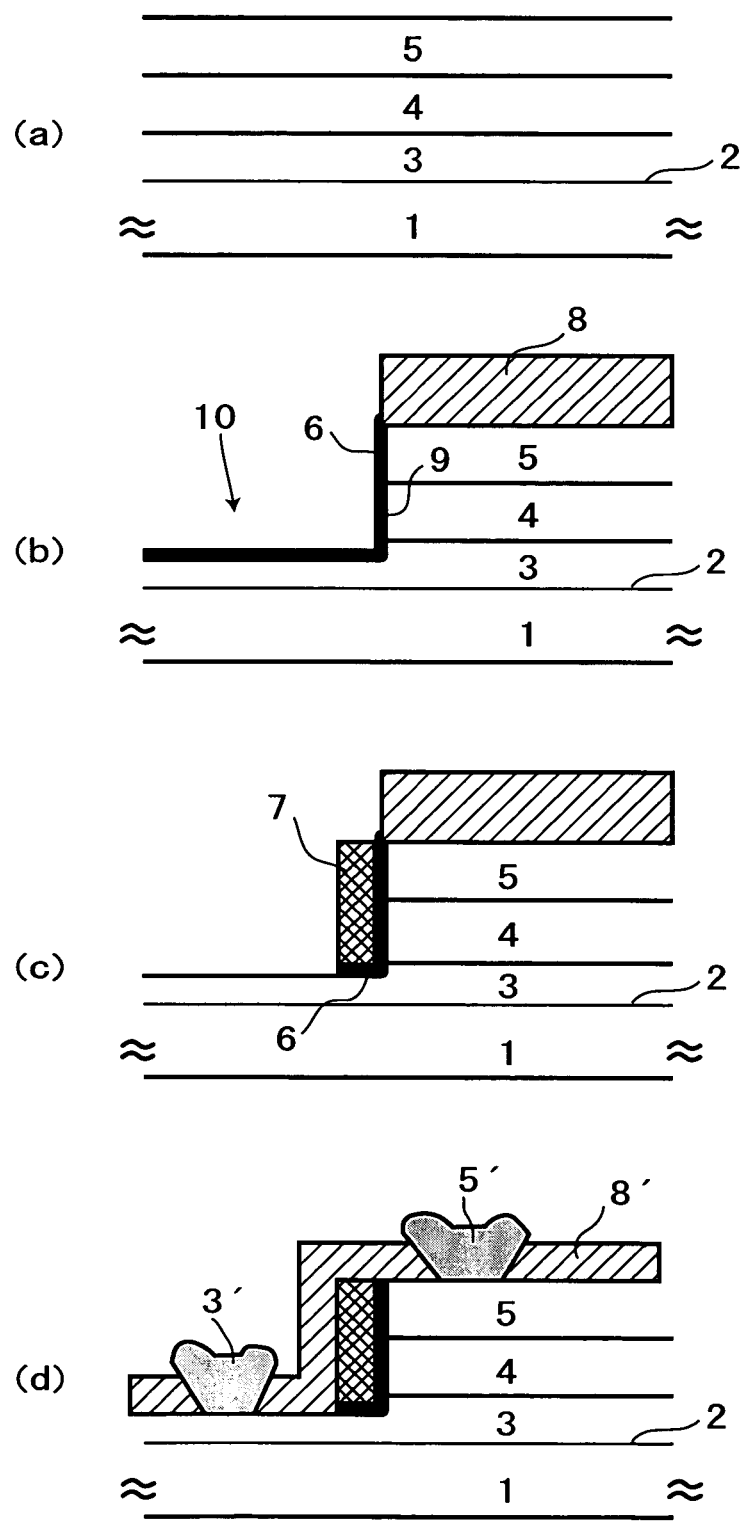
FIG. 3 shows a method of manufacturing a vertical type short channel insulated-gate static induction transistor of the present invention.

Next, a method of manufacturing a vertical type short channel insulated-gate static induction transistor of the present invention will be explained as embodiment 1. FIG. 3 is a diagrammatic view showing a method of manufacturing a vertical type short channel insulated-gate static induction transistor of the present invention.

As shown in FIG. 3(a), a drain layer 3 is grown epitaxially on the main surface 2 of a Si substrate 1 with (100) oriented plane. The drain layer 3 may be formed by introducing impurities into the Si substrate 1 by either a thermal diffusion or an ion implantation. Next, a channel layer 4 is grown epitaxially on the drain layer 3. In order to realize a channel length of 1000 Å to 100 Å accurately, the molecular layer epitaxy (see, for example, U.S. Pat. No. 5,294,286) is used for the epitaxial growth of the channel layer 4.

The Si substrate 1 with the drain layer 3 formed on it is set in a vacuum vessel for the molecular layer epitaxy, for example to form the channel layer 4 of n type impurity concentration n=$3\times10^{19}$ cm$^{-3}$, Si$_2$H$_6$ gas is introduced into a vacuum vessel at crystal growth temperature 510° C., the substrate 1 is exposed for 30 seconds to Si$_2$H$_6$ gas at a pressure of $4\times10^{-2}$ Pa, then Si$_2$H$_6$ gas is evacuated for 2 seconds, and then PH$_3$ gas is introduced into the vacuum vessel, the substrate is exposed for 10 seconds to PH$_3$ gas at a pressure of $5\times10^{-6}$ Pa, then PH$_3$ gas is evacuated for 2 seconds. By carrying out one cycle of the above mentioned process as a unit cycle, mono molecular epitaxial layer which consists of a Si single crystal of n type impurity concentration of n=$3\times10^{19}$ cm$^{-3}$ is grown, and by repeating the cycle by the number of times corresponding to the number of molecular layers of the channel layer 4, the desired film thickness of the channel layer 4 is grown.

The grown film thickness by the above mentioned unit cycle is 1.15 Å on a silicon (001) or its equivalent plane, and this film thickness corresponds to 85% of the thickness of mono atomic layer. Thus, the silicon single crystal layer thickness of 1.15 Å can be grown by each cycle. That is, in order to form the channel length of 100 Å, the above mentioned cycle should be repeated about 85 times.

In order to form the channel layer 4 of a p type impurity concentration p=$1\times10^{20}$ cm$^{-3}$ for example, the above mentioned substrate is exposed for 30 seconds to Si$_2$H$_6$ gas at a pressure of $4\times10^{-2}$ Pa by introducing Si$_2$H$_6$ gas into a vacuum vessel at the crystal growing temperature 510° C., then Si$_2$H$_6$ gas is evacuated for 2 seconds, and exposed for 10 seconds to B$_2$H$_6$ gas at a pressure of $5\times10^{-5}$ Pa by introducing B$_2$H$_6$ gas into the vessel, then B$_2$H$_6$ gas is evacuated for 2 seconds. By repeating cycles of the above mentioned process as a unit cycle, the channel layer 4 which consists of a Si single crystal of a p type impurity concentration of p=$1\times10^{20}$ cm$^{-3}$ and has a desired thickness is grown.

In order to grow a non-doped Si single crystal, the above mentioned substrate is exposed for 30 seconds to Si$_2$H$_6$ gas at a pressure of $4\times10^{-2}$ Pa by introducing Si$_2$H$_6$ gas into a vacuum vessel, then Si$_2$H$_6$ gas is evacuated for 2 seconds. By repeating cycles of above mentioned process as a unit cycle, the non-doped single crystal Si layer which has desired film thickness is grown up.

Next, the source layer 5 is grown epitaxially. Needless to say that the epitaxial drain layer 3 and the source layer 5 may be grown by using either the above mentioned molecular layer epitaxy or the conventional epitaxial growth techniques. The doping density of the source layer 5 and the drain layer 3 is about $10^{18}$ to $10^{21}$ cm$^{-3}$. It is needless to say that the conduction type may be either p or n type, and 5 may be the drain and 3 may be the source.

The impurity concentration of the channel layer 4 is about $10^{16}$ to $10^{21}$ cm$^{-3}$, and its conduction type is opposite to those of the source 5 and the drain 3. The channel layer 4 may be a multilayer structure, such as an i-p-i structure which sandwiches the p layer with non-doped i layers. The vertical type short channel insulated-gate static induction transistor having i-p$^+$-i multilayer structure of total channel length of 100 Å in which film thickness is 40 Å, 20 Å, and 40 Å, respectively, was fabricated experimentally and its good operation performance was confirmed.

In FIG. 3(b) is shown, a passivation film 8 is deposited, the passivation film 8 is removed partially to make the opening in the portion of the device forming region by etching to the direction perpendicular to the main surface 2 of the Si substrate 1 by using the anisotropic plasma etching or the like, and thus a U-shaped groove 10 with a sidewall 9 consisting of the passivation film 8, the source layer 5, the channel layer 4, and the drain layer 3, which is perpendicular to the main surface 2, is formed. In the figure, only a half of the U-shaped groove 10 is illustrated.

The plasma etching using PCl$_3$ (phosphorus trichloride), for example, is used for the anisotropic plasma etching. The depth of the U-shaped groove 10 may be such that it reaches to the drain layer 3, or the inside of the drain layer 3.

Next, the gate oxide film layer 6 is deposited on the substrate in which the U-shaped groove 10 has been formed. In order to lower the temperature at the time of gate oxide film layer 6 formation, it should be formed by using low temperature plasma CVD method using Si$_2$H$_6$ and an active oxygen, and SiO$_2$ is deposited to the thickness of 20 to 100 Å. An example of deposition condition is such that the substrate temperature is 470° C., Si$_2$H$_6$ gas pressure is $7\times10^{-2}$ Pa, the active oxygen gas pressure is about $10^{-1}$ Pa, and the power of plasma supply is 200 W.

As shown in FIG. 3(c), a polysilicon layer 7 which will function as a gate electrode is deposited onto the substrate with the gate oxide film layer 6 deposited on it. The polysilicon layer 7 is deposited to the thickness of about 500 to 5000 Å by using low temperature plasma CVD method with Si$_2$H$_6$.

Next, the gate electrode 7 and gate oxide film 6 are formed by etching the deposited polysilicon layer 7 and the deposited oxide film layer 6 using the anisotropic plasma etching. The anisotropic plasma etching is carried out by using PCl$_3$ gas at a pressure of 3 to 30 Pa. This anisotropic plasma etching has a high etching speed in the direction perpendicular to the main surface of Si substrate 1. Since the thickness in the direction perpendicular to the main surface 2 of the sidewall 9 of the polysilicon layer 7 is thicker as the thickness of passivation film 8 than the film thickness of the polysilicon layer 7, an insulated-gate consisting of the gate oxide film 6 and the gate electrode 7 can be left only on the sidewall 9 by selecting the etching time when the thickness of the polysilicon corresponding to the film thickness of passivation film 8 is etched out.

Next, as shown in FIG. 3(*d*), the whole process is completed by deposition of the passivation film 8' on the substrate in which the insulated-gate was formed, and then by forming the source electrode 5' and the drain electrode 3' after opening contact holes.

According to this manufacturing method mentioned above, the vertical type snort channel insulated-gate static induction transistor can be manufactured by the Si semiconductor technology which is now most widely used.

The vertical type short channel insulated-gate static induction transistor with a gate length 1000 Å or less can be fabricated with a high accuracy without using X-ray photolithography.

The insulated-gate can be formed perpendicular to the channel layer, since the U-shaped groove with vertical sidewall can be formed.

Also, the channel of length from 1000 Å to 100 Å can be formed with ease and a high accuracy, since it is grown by the molecular layer epitaxy.

And, also the process temperature to deposit the gate oxide film by using low temperature CVD is low, so that the channel length can be controlled to the designed value, since the impurities in the channel layer, the source layer, and the drain layer are not redistributed.

In addition, the channel length is not changed, and the impurities are not re-distributed, since the process to deposit the gate electrode layer is a low temperature CVD process.

The gate electrode and the gate oxide film can be left on the sidewall portion, since the gate electrode is etched by the method mentioned above, namely by the self aligned anisotropic etching.

The embodiment 2 will be explained next. FIG. 4 shows a method of manufacturing and a structure of a low power consumption vertical type short channel insulated-gate static induction transistor manufactured by the method of the present invention.

As shown in FIG. 4(*b*), the only difference from the embodiment 1 is depositing a sidewall channel layer 31 just before a deposition of gate oxide film layer 6. The sidewall channel layer 31 is the non-doped silicon epitaxial single crystal layer of impurity concentration ranged from $10^{12}$ to $10^{16}$ cm$^{-3}$ grown to a thickness of 20 to 100 Å by using the molecular layer epitaxy. This transistor can reduce the leakage current accompanied with short channellization at OFF state of the transistor, and therefore can reduce the STANDBY power without lowering its operation speed by the suitable adjustment of the impurity concentration of the sidewall channel 31 and the channel layer 4 on the bulk side.

Figure 5:
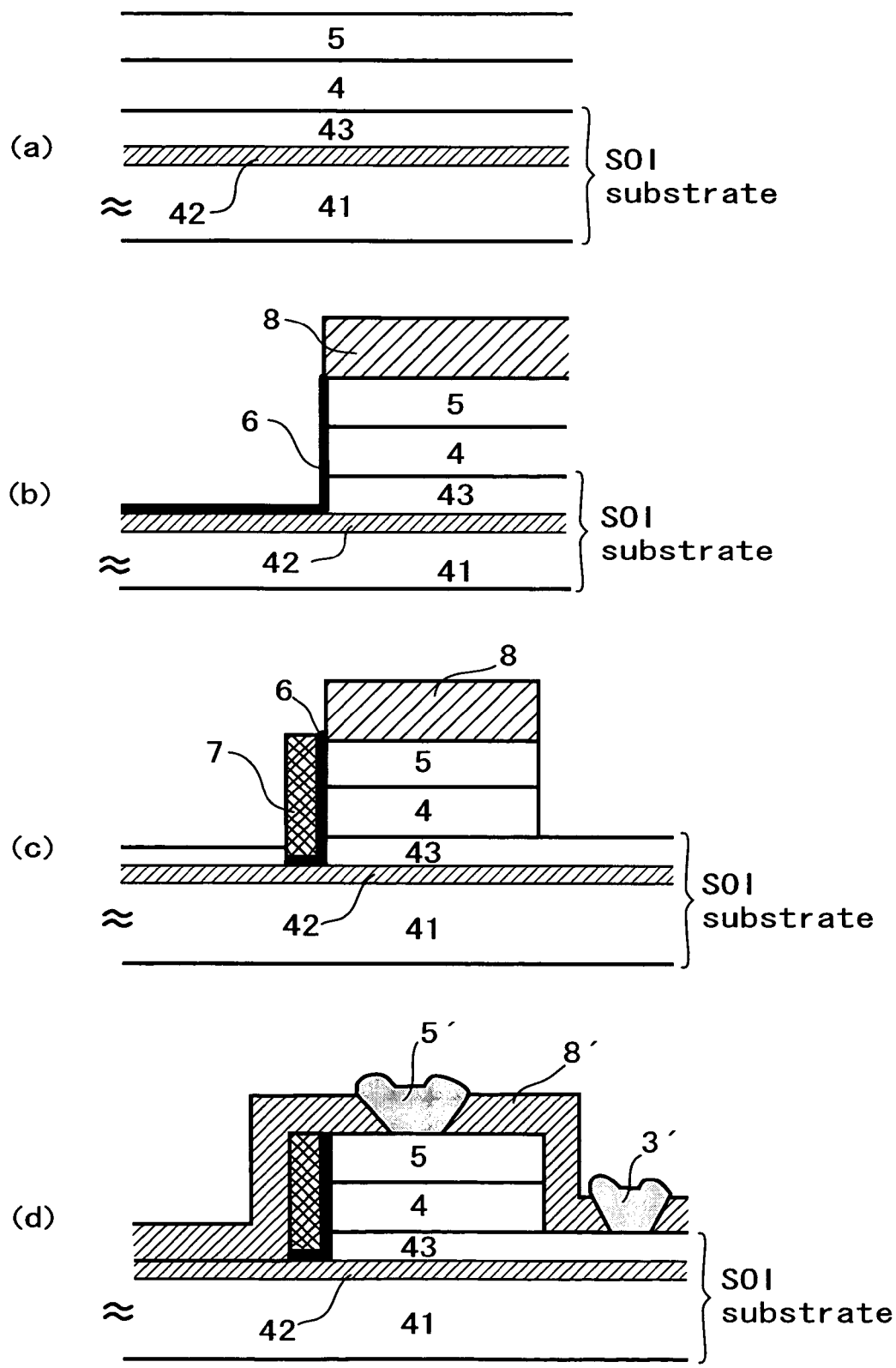
FIG. 5 shows a method of manufacturing and a structure of the vertical type short channel insulated-gate static induction transistor manufactured by a method of the present invention on an SOI substrate.

Next, the embodiment 3 will be explained. FIG. 5 shows a method of manufacturing and a structure of a vertical type short channel insulated-gate static induction transistor formed on an SOI substrate manufactured by the method of the present invention. The SOI (Silicon on Insulator) is a substrate in which Si single crystal layer 43 is formed on SiO$_2$ layer 42, and SiO$_2$ layer 42 is formed on Si substrate 41.

As shown in FIG. 5(*a*), the only difference from the embodiment 1 is using a Si single crystal layer 43 of the SOI substrate as the drain layer. The parasitic capacitance of the gate decreases and the operation speed is further improved since the vertical type short channel insulated-gate static induction transistor formed on the SOI substrate has a good electrical isolation between the substrate and the device layer. It also has another effects, such as improvements of insulation breakdown voltage and the radiation tolerance characteristics in the device, so the device can be used for the integrated circuits and the like for which a high environmental reliability is required.

Figure 6:
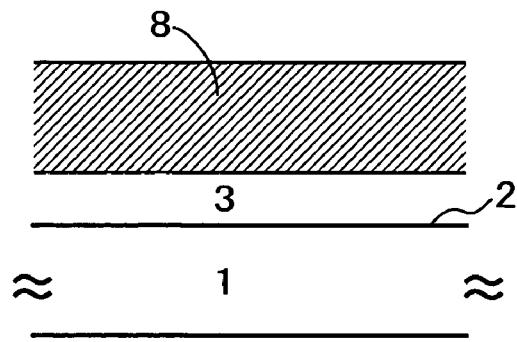
FIG. 6 shows a method of manufacturing a planar type short channel insulated-gate static induction transistor of the present invention.
Figure 6:
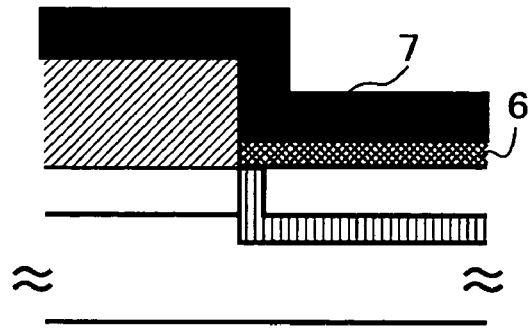
Figure 6:
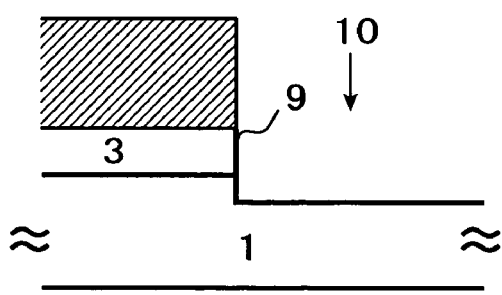
Figure 6:
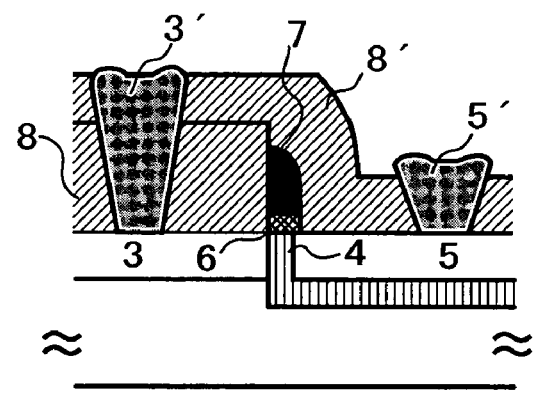
Figure 6:
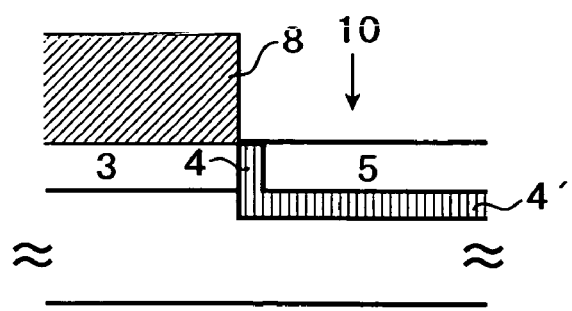

Next, the method of manufacturing the planar type short channel insulated-gate static induction transistor of the present invention will explained using the embodiment 4. FIG. 6 shows a diagrammatic view of a manufacturing method of a planar short channel insulated-gate static induction transistor according to the present invention.

As shown in FIG. 6(*a*), a passivation film 8 of SiO$_2$ is formed using chemical vapor deposition (CVD) method after forming a drain layer 3 on a main surface 2 of a Si substrate 1 having a Si (100) plane. The drain layer 3 is formed either by introducing impurities into the substrate 1 by thermal diffusion or by ion implantation, or by epitaxial growth with impurity doping, and either one of the methods may be chosen by technical necessity.

As shown in FIG. 6(*b*), the passivation film 8 is partially removed to make the opening in the portion of the device forming region, an etching is performed in the direction perpendicular to the main surface 2 of Si substrate 1 by the anisotropic plasma etching or the like, and a U-shaped groove 10 is formed having a sidewall 9 perpendicular to the main surface 2, which consists of the passivation film 8, the drain layer 3, and the Si substrate 1. In the figure, only a half portion of the U-shaped groove 10 is illustrated.

The plasma etching using PCl$_3$ (phosphorus trichloride), for example, is used for the anisotropic plasma etching.

The depth of the U-shaped groove 10 may be such that it reaches to the Si substrate 1, or to the inside of the Si substrate 1.

As shown in FIG. 6(*c*), a channel layer 4 and 4' are grown epitaxially onto the sidewall 9 of the drain layer 3, the portion of Si substrate 1, and the bottom portion of the U-shaped groove 10, followed by selective epitaxial growth of the source layer 5 on the sidewall portion of the channel layer 4' and the bottom portion of the channel layer 4'.

The selective epitaxial growth in the above mentioned method is performed by choice of the crystal plane direction and using the molecular layer epitaxy explained below without any auxiliary process such as protecting other non grown region.

The Si substrate 1 with U-shaped groove 10 formed on it is set in a vacuum vessel for the molecular layer epitaxy, for example to form the channel layer 4 of n type impurity concentration n=3×10$^{19}$ cm$^{-3}$, Si$_2$H$_6$ gas is introduced into a vacuum vessel at crystal growth temperature 510° C., the above mentioned substrate is exposed for 30 seconds to Si$_2$H$_6$ gas at a pressure of 4×10$^{-2}$ Pa, then Si$_2$H$_6$ gas is evacuated for 2 seconds, and then PH$_3$ gas is introduced into the vacuum vessel, the substrate is exposed for 10 seconds to PH$_3$ gas at a pressure of 5×10$^{-6}$ Pa, then PH$_3$ gas is evacuated for 2 seconds. By repeating cycles of the above mentioned process as a unit cycle, the channel layer 4 which consists of a Si single crystal of n type impurity concentration of n=3×10$^{19}$ cm$^{-3}$ and has the predetermined film thickness, is grown.

The grown film thickness by the above mentioned unit cycle is 1.15 Å on a silicon (001) or its equivalent plane, and this film thickness corresponds to 85% of the thickness of mono atomic layer. Thus, the silicon single crystal layer thickness of 1.15 Å can be grown by the each cycle. The silicon single crystal film of 1.15 Å thickness can be grown by the each cycle on the drain layer 3 of the sidewall 9 and on the Si substrate 1, if the plane direction of Si substrate 1 and the arrangement direction of the source layer 3, the channel layer 4, and the drain layer 5 are chosen so that the plane of the drain layer 3 of the sidewall 9 is (001) or its equivalent. That is, in order to form the channel length of 100 Å, the above mentioned cycle should be repeated about 85 times.

Under this growth condition, silicon is not deposited at all onto the passivation film 8, but is grown selectively onto the drain layer 3 of the sidewall 9 and the Si substrate 1.

In order to form the source layer 5 of a p type impurity concentration $p=1\times10^{20}$ cm$^{-3}$ for example, the above mentioned substrate is exposed for 30 seconds to Si$_2$H$_6$ gas at a pressure of $4\times10^{-2}$ Pa by introducing Si$_2$H$_6$ gas into a vacuum vessel at the crystal growing temperature 510° C., then Si$_2$H$_6$ gas is evacuated for 2 seconds, and then exposed for 10 seconds to B$_2$H$_6$ gas at a pressure of $5\times10^{-5}$ Pa by introducing B$_2$H$_6$ gas into the vessel, then B$_2$H$_6$ gas is evacuated for 2 seconds. By repeating the cycle of above mentioned process as a unit cycle, the source layer 5 which consists of a Si single crystal of a p type impurity concentration of $p=1\times10^{20}$ cm$^{-3}$ and has a predetermined film thickness, can be grown.

In order to grow a non-doped Si single crystal, the above mentioned substrate is exposed for 30 seconds to Si$_2$H$_6$ gas at a pressure of $4\times10^{-2}$ Pa by introducing Si$_2$H$_6$ gas into a vacuum vessel, and then Si$_2$H$_6$ gas is evacuated for 2 seconds. By repeating cycles of above mentioned process as a unit cycle, the non-doped single crystal Si layer which has a predetermined film thickness can be grown.

The impurity concentration of the source layer 5 and the drain layer 3 is about $10^{16}$ to $10^{21}$ cm$^{-3}$. Needless to say that the conduction type may be either p type or n type, and 5 may be the drain and 3 may be the source. The impurity concentration of the channel layer 4 is about $10^{16}$ to $10^{21}$ cm$^{-3}$, and its conduction type is opposite to those of the source layer 5 and the drain layer 3. Also, the channel layer 4 may be the multilayer structure, such as an i-p-i structure which sandwiches the p layer with non-doped i layers. The planar type short channel insulated-gate static induction transistor having i-p$^+$-i multilayer structure of total channel length of 100 Å, in which film thickness is 40 Å, 20 Å, and 40 Å, respectively, was fabricated experimentally. And its good operation performance was confirmed.

Next, as shown in FIG. 6(*d*), a gate oxide film layer 6 and a polysilicon layer 7 which will function as gate electrode is deposited. In order to lower the temperature at the formation of gate oxide film layer 6, it is formed by using low temperature plasma CVD method using Si$_2$H$_6$ gas and an active oxygen gas, and SiO$_2$ is deposited to the thickness of 20 to 100 Å. An example of deposition condition is such that the substrate temperature is 470° C., Si$_2$H$_6$ gas pressure is $7\times10^{-2}$ Pa, the active oxygen pressure is about $10^{-1}$ Pa, and the power of plasma supply is 200 W. A polysilicon layer 7 which will function as a gate electrode is deposited to a thickness of about 500 to 5000 Å by using low temperature plasma CVD method with Si$_2$H$_6$ gas. According to this process as illustratively shown in FIG. 6(*d*), the polysilicon 7 deposits also on the sidewall 9.

As shown in FIG. 6(*e*), the gate oxide film 6 and the gate electrode 7 are formed by etching the deposited polysilicon layer 7 and oxide film layer 6 using the anisotropic plasma etching. The anisotropic plasma etching is carried out by using PCl$_3$ gas at a pressure of 3 to 30 Pa. This anisotropic plasma etching has a high etching speed in the direction perpendicular to the main surface 2 of Si substrate 1. Since the thickness of the polysilicon layer 7 on the sidewall 9 in the direction perpendicular to the main surface 2 is thicker as a thickness of the passivation film 8 than the film thickness of the polysilicon layer 7, the insulated-gate consisting of the gate oxide film 6 and the gate electrode 7, which has the width approximately equal to the channel length L, can be left on the sidewall 9 and just above the channel 4, if the anisotropic etching with a high etching speed in the direction perpendicular to the main surface 2 is performed by controlling the etching time.

Next, the whole process is completed by deposition of a passivation film 8' on the substrate in which the insulated-gate was formed, and then by forming a source electrode 5' and a drain electrode 3' after opening contact holes.

According to this manufacturing method mentioned above, the planar type short channel insulated-gate static induction transistor can be manufactured by the Si semiconductor technology which is now most widely used.

The planar type short channel insulated-gate static induction transistor with a gate length 1000 Å or less can be fabricated with a high accuracy without using X-ray photolithography.

The source, the channel, and the drain of the insulated-gate static induction transistor can be arranged in parallel with the main surface of the semiconductor substrate, since the U-shaped groove with vertical sidewall can be formed.

Also, since the channel is grown by the molecular layer epitaxy, the channel of length from 1000 Å to 100 Å can be formed with ease and a high accuracy, and also the epitaxial channel layer can be grown selectively only onto the sidewall and bottom of the U-shaped groove. In addition, as a single crystal film is grown, such a high temperature thermal treatment for an impurity activation etc. is not necessary.

And, also the process temperature to deposit the gate oxide film by using low temperature CVD is low, so that the channel length can be controlled to the designed value, since the impurities in the channel layer, the source layer, and the drain layer are not redistributed.

In addition, the process to deposit the gate electrode layer is a low temperature CVD process, so that it can be deposited on the sidewall of the U-shaped groove, and impurities are not re-distributed.

Further, the gate electrode and the gate oxide film having a width as same as that of the channel length can be left on the sidewall portion, since the gate electrode is etched by the self aligned anisotropic etching.

Since the substrate with Si (100) oriented plane is used and the arrangement direction of the source, the channel, and the drain is made to <010> or <001> directions, then the plane direction of the sidewall surface of U-shaped groove becomes (010) or (001) plane, and it is made possible to be grown the channel layer selectively onto the sidewall surface by virtue of using the molecular layer epitaxy.

Figure 7:
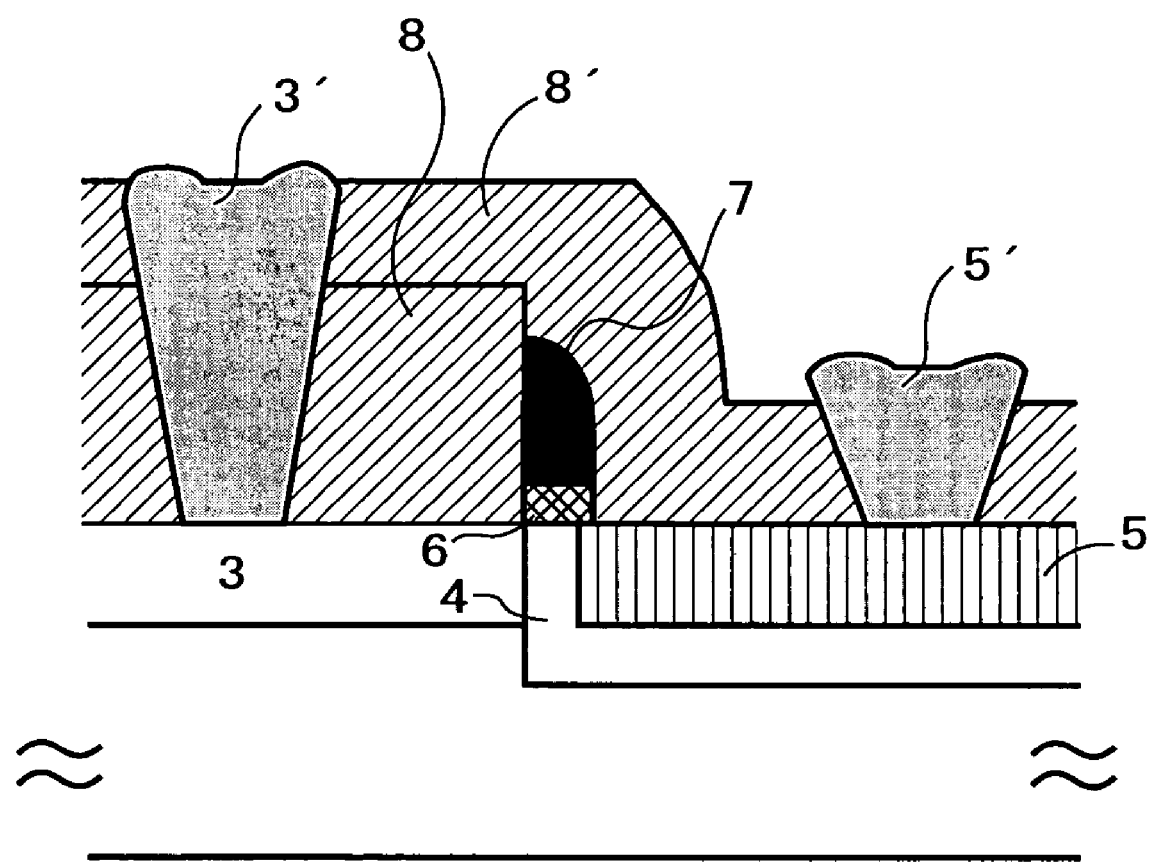
FIG. 7 shows a structure of a tunnel injection type insulated-gate static induction transistor manufactured by a method of the present invention.
Figure 8:
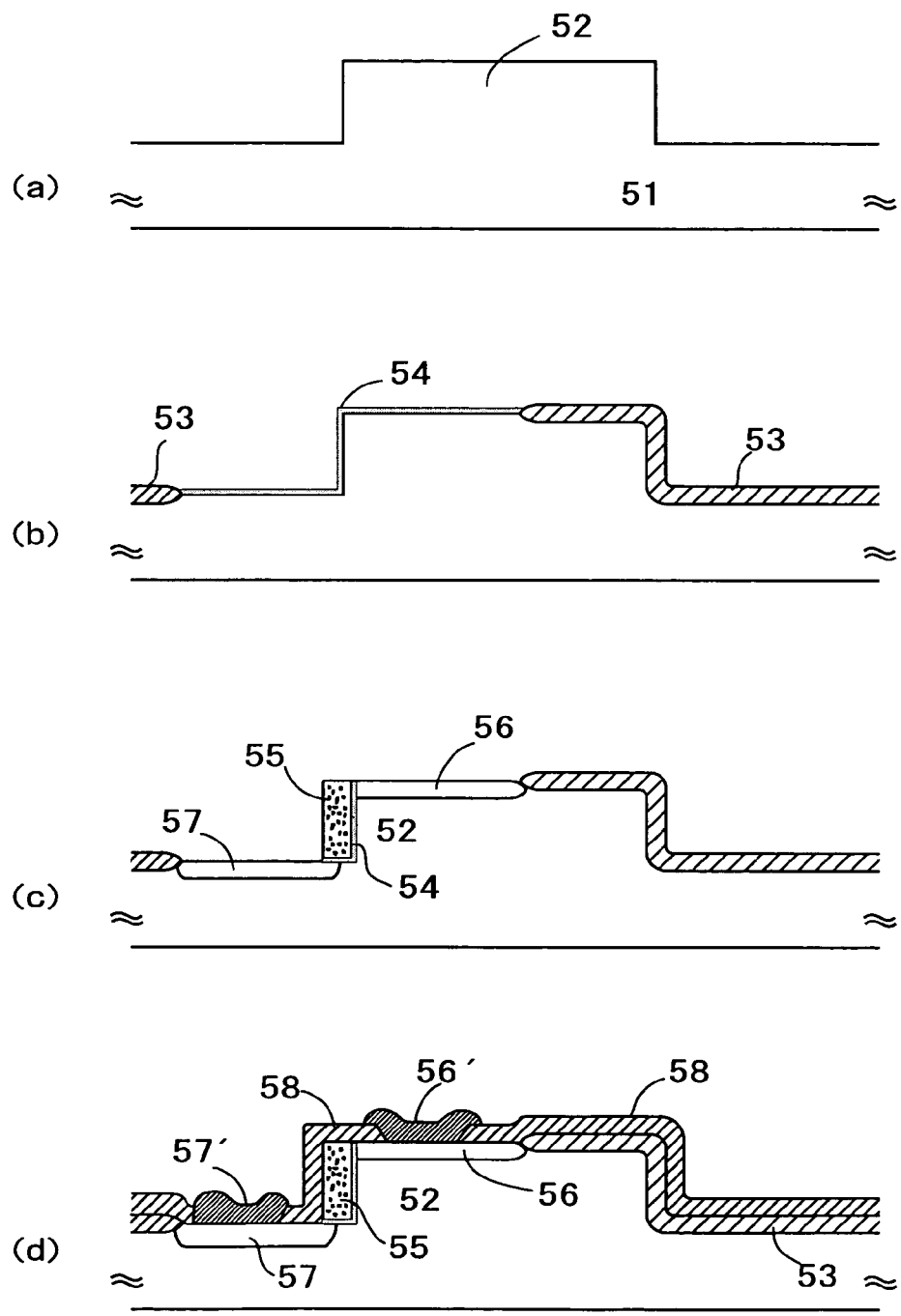
FIG. 8 shows a method of manufacturing and the structure of a prior art insulated-gate static induction transistor.

Next, the embodiment 5 of the present invention will be explained. FIG. 7 is a diagrammatic view showing a structure of the tunnel injection type insulated-gate static induction transistor fabricated by a manufacturing method of the planar short channel insulated-gate static induction transistor according to the present invention.

In this embodiment, a source layer 5 is a p$^+$ doped layer, a drain layer 3 is a n$^-$ doped layer, and a channel layer 4 is a single crystal epitaxially grown film of a thickness 10 to 1000 Å and of a low impurity concentration. The conduction type of the source layer and the drain layer are the same in those of the embodiment 4, on the other hand they are different in the structure of tunnel injection type in this embodiment. The good device operation performance was confirmed also in this embodiment.

Although the present invention has hereinbefore been set forth with respect to certain illustrative forms of an embodiment thereof, it will readily be appreciated to be obvious to a person skilled in the art that many alternations thereof, omissions therefrom and additions thereto can be made without departing from the essences and the scope of the present invention. Accordingly, it should be understood that the invention is not intended to the specific forms of the embodiment thereof set forth below, but to include all possible forms of the embodiment thereof that can be made within the scope with respect to the features specifically set forth in the appended claims and encompasses all the equivalents thereof.

INDUSTRIAL APPLICABILITY

As will have been appreciated from the foregoing description, the present invention provides an ultra-high speed vertical type short channel insulated-gate static induction transistor with the channel length from 1000 to 100 Å, and also provides a method of manufacturing vertical type short channel insulated-gate static induction transistor of uniform operation characteristic.

Accordingly, a planar type short channel insulated-gate static induction transistor of the present invention and a method of manufacturing the same, a planar type short channel insulated-gate static induction transistor with the channel length from 1000 to 100 Å, and with parasitic capacitance as small as to the limit, so hence of ultra-high speed, can be provided.

If the transistors of the present invention is used for a high speed amplification circuit, a high speed integrated circuit, etc., it is quite useful as the next generation ultra high speed amplification circuit, an ultra high speed integrated circuit, etc.

What is claimed is:

1. A vertical type short channel insulated-gate static induction transistor comprising:

a drain layer consisting of an epitaxial single crystal layer on a main surface of a substrate;

a channel layer consisting of an epitaxial single crystal layer of thickness 1000 Å or less on said drain layer;

a source layer consisting of an epitaxial single crystal layer on said channel layer, and an insulated-gate being formed on the sidewall of said drain layer, said channel layer, and said source layer.

2. A vertical type short channel insulated-gate static induction transistor as set forth in claim 1, characterized in that said substrate being a Si single crystal, said main surface being a (100) or its equivalent plane, said channel layer being a p type Si epitaxial single crystal layer, said source layer and said drain layer being an n type Si epitaxial single crystal layers, and said insulated-gate consisting of the $SiO_2$ and the polysilicon.

3. A vertical type short channel insulated-gate static induction transistor as set forth in claim 1, characterized in that said substrate being Si single crystal, said main surface being a (100) or its equivalent plane, said channel layer being n type Si epitaxial single crystal layer, said source layer and said drain layer being a p type Si epitaxial single crystal layer, and said insulated-gate consisting of the $SiO_2$ and the polysilicon.

* * * * *